United States Patent
Kim et al.

(10) Patent No.: US 8,262,928 B2
(45) Date of Patent: *Sep. 11, 2012

(54) ETCHANT AND METHOD OF MANUFACTURING AN ARRAY SUBSTRATE USING THE SAME

(75) Inventors: Bong-Kyun Kim, Incheon (KR); Jong-Hyun Choung, Hwaseong-si (KR); Byeong-Jin Lee, Seoul (KR); Sun-Young Hong, Yongin-si (KR); Hong-Sick Park, Suwon-si (KR); Shi-Yul Kim, Yongin-si (KR); Ki-Beom Lee, Seoul (KR); Sam-Young Cho, Uiwang-si (KR); Sang-Woo Kim, Seongnam-si (KR); Hyun-Cheol Shin, Suwon-si (KR); Won-Guk Seo, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 28 days.

This patent is subject to a terminal disclaimer.

(21) Appl. No.: 12/777,532

(22) Filed: May 11, 2010

(65) Prior Publication Data
US 2010/0291722 A1 Nov. 18, 2010

(30) Foreign Application Priority Data
May 14, 2009 (KR) .............................. 2009-0042173

(51) Int. Cl.
*H01L 33/44* (2010.01)
*C09K 13/08* (2006.01)
(52) U.S. Cl. .................... 252/79.3; 252/79.1; 438/754
(58) Field of Classification Search .................. 438/745, 438/754; 252/79.1, 79.3
See application file for complete search history.

(56) References Cited

U.S. PATENT DOCUMENTS

| | | | |
|---|---|---|---|
| 2006/0046490 A1* | 3/2006 | Banerjee et al. | 438/692 |
| 2008/0224092 A1* | 9/2008 | Choung et al. | 252/79.3 |
| 2008/0254628 A1* | 10/2008 | Boggs et al. | 438/693 |
| 2008/0315154 A1* | 12/2008 | Kollodge | 252/79.1 |

* cited by examiner

*Primary Examiner* — Alexander Ghyka
(74) *Attorney, Agent, or Firm* — F. Chau & Associates, LLC

(57) ABSTRACT

An etchant includes about 0.1 percent by weight to about 30 percent by weight of ammonium persulfate $(NH_4)_2S_2O_8$, about 0.1 percent by weight to about 10 percent by weight of an inorganic acid, about 0.1 percent by weight to about 10 percent by weight of an acetate salt, about 0.01 percent by weight to about 5 percent by weight of a fluorine-containing compound, about 0.01 percent by weight to about 5 percent by weight of a sulfonic acid compound, about 0.01 percent by weight to about 2 percent by weight of an azole compound, and a remainder of water. Accordingly, the etchant may have high stability to maintain etching ability. Thus, manufacturing margins may be improved so that manufacturing costs may be reduced.

12 Claims, 2 Drawing Sheets

ETCHANT AND METHOD OF MANUFACTURING AN ARRAY SUBSTRATE USING THE SAME

CROSS-REFERENCE TO RELATED APPLICATION

This application claims priority under 35 U.S.C. §119 to Korean Patent Application No. 2009-0042173, filed on May 14, 2009, the disclosure of which are hereby incorporated by reference herein in it's entirety.

BACKGROUND OF THE INVENTION

1. Technical Field

Example embodiments of the present invention relate to an etchant and to a method of manufacturing an array substrate using the etchant. More particularly, example embodiments of the present invention relate to an etchant etching a titanium/copper (Ti/Cu) bilayer and to a method of manufacturing an array substrate using the etchant.

2. Description of Related Art

A liquid crystal display (LCD) device may be driven by an electric circuit, for example, a thin-film transistor (TFT) circuit. Manufacturing processes for a TFT-LCD device may include a deposition process that includes depositing a metal layer using a material for source/drain electrodes, and an etching process that includes selectively removing the metal layer using a corrosive gas or a corrosive liquid to form a metal line of an electric circuit.

A plurality of thin layers or thin films may be disposed on a TFT substrate. Thus, a metal line of the TFT substrate may preferably have a gently tapered shape, of which an etching profile slopes down uniformly, and a lower width of the metal line is wider than an upper width of the metal line.

Copper may have a low resistance and may be readily and economically used. Thus, the electric resistance of a metal line formed from a copper layer may be much less than that of a metal line formed from an aluminum layer or a chromium layer. Furthermore, copper may be more environment-friendly than aluminum or chromium. However, copper may have a relatively high resistance against oxidizers compared to aluminum or chromium. Thus, an etching solution including hydrogen peroxide or ferric iron may be used for etching a copper layer.

However, hydrogen peroxide may cause disproportionation in the presence of copper ions and iron ions to be decomposed into water and oxygen. The above-mentioned disproportionation may in turn cause heat and rapid changing of compositions to thereby deteriorate manufacturing process margins and stability. To solve the above-mentioned difficulties, hydrogen peroxide may be used with a stabilizer for hydrogen peroxide, which may increase manufacturing costs.

SUMMARY OF THE INVENTION

Example embodiments of the present invention may provide an etchant capable of simultaneously etching a titanium/copper (Ti/Cu) bilayer, which is capable of improving etching process margins and stability.

Example embodiments of the present invention may also provide a method of manufacturing an array substrate using the etchant.

In accordance with an example embodiment of the present invention, an etchant is provided. The etchant includes about 0.1 percent by weight to about 30 percent by weight of ammonium persulfate $(NH_4)_2S_2O_8$, about 0.1 percent by weight to about 10 percent by weight of an inorganic acid, about 0.1 percent by weight to about 10 percent by weight of an acetate salt, about 0.01 percent by weight to about 5 percent by weight of a fluorine-containing compound, about 0.01 percent by weight to about 5 percent by weight of a sulfonic acid compound, about 0.01 percent by weight to about 2 percent by weight of an azole compound, and a remainder of water.

In an example embodiment of the present invention, the inorganic acid may include nitric acid, phosphoric acid, sulfuric acid, hydrochloric acid and the like. These can be used alone or in a combination thereof.

In an example embodiment of the present invention, the acetate salt may include ammonium acetate ($CH_3COONH_4$), lithium acetate ($CH_3COOLi$), potassium acetate ($CH_3COOK$) and the like. These can be used alone or in a combination thereof.

In an example embodiment of the present invention, the fluorine-containing compound may include sodium fluoride (NaF), sodium bifluoride ($NaHF_2$), ammonium fluoride ($NH_4F$), ammonium bifluoride ($NH_4HF_2$), ammonium fluoroborate ($NH_4BF_4$), potassium fluoride (KF), potassium bifluoride ($KHF_2$), aluminum fluoride ($AlF_3$), fluoroboric acid ($HBF_4$), lithium fluoride (LiF), potassium tetrafluoroborate ($KBF_4$), calcium fluoride ($CaF_2$) and the like. These can be used alone or in a combination thereof.

In an example embodiment of the present invention, the sulfonic acid compound may include methanesulfonic acid ($CH_3SO_3H$), benzenesulfonic acid ($C_6H_5SO_3H$), p-toluenesulfonic acid ($C_7H_7SO_3H$) and the like. These can be used alone or in a combination thereof.

In an example embodiment of the present invention, the azole compound may include benzotriazole, aminotetrazole, aminotetrazole potassium salt, imidazole, pyrazole and the like. These can be used alone or in a combination thereof.

In an example embodiment of the present invention, the etchant may further include about 0.01 percent by weight to about 5 percent by weight of a boron-containing compound.

In an example embodiment of the present invention, the boron-containing compound may include borate ($R_1BO_3$, $R_2HBO_3$, $R_3H_2BO_3$), metaborate ($R_3BO_2$), tetraborate ($R_2B_4O_7$, $R_3HB_4O_7$), ammonium fluoroborate ($NH_4BF_4$), fluoroboric acid ($HBF_4$), lithium fluoroborate ($LiBF_4$), sodium fluoroborate ($NaBF_4$), potassium fluoroborate ($KBF_4$) and the like. These can be used alone or in a combination thereof R1 represents $H_3$, $Li_3$, $Na_3$, $(NH_4)_3$ or $K_3$; R2 represents $Li_2$, $Na_2$, $K_2$ or $(NH_4)_2$; and R3 represents Li, Na, K or $NH_4$.

In an example embodiment of the present invention, the etchant may simultaneously etch a first metal layer including titanium and a second metal layer including copper.

In accordance with another example embodiment of the present invention, a method of manufacturing an array substrate is provided. In the method, a base substrate is formed. A gate line and a gate electrode are formed by patterning a first conductive layer formed on the base substrate. A semiconductor layer is formed on the base substrate including the gate line formed thereon. A source electrode and a drain electrode are formed by patterning a second conductive layer formed on the semiconductor layer. A passivation layer is formed including a contact hole formed therethrough. The contact hole exposes a portion of the drain electrode. A pixel electrode is formed by patterning a third conductive layer formed on the passivation layer. The pixel electrode is electrically connected to the drain electrode through the contact hole. The first and the second conductive layer are patterned using an etchant including ammonium persulfate ($NH_4$)

$_2S_2O_8$, an inorganic acid, an acetate salt, a fluorine-containing compound, a sulfonic acid compound, an azole compound, and water.

In an example embodiment of the present invention, the etchant may include about 0.1 percent by weight to about 30 percent by weight of ammonium persulfate, about 0.1 percent by weight to about 10 percent by weight of an inorganic acid, about 0.1 percent by weight to about 10 percent by weight of an acetate salt, about 0.01 percent by weight to about 5 percent by weight of a fluorine-containing compound, about 0.01 percent by weight to about 5 percent by weight of a sulfonic acid compound, about 0.01 percent by weight to about 2 percent by weight of an azole compound, and a remainder of water.

In an example embodiment of the present invention, the etchant may further include about 0.01 percent by weight to about 5 percent by weight of a boron-containing compound.

In an example embodiment of the present invention, at least one selected from the first conductive layer and the second conductive layer may include a first metal layer including titanium and a second metal layer including copper and formed on the first metal layer In accordance with another example embodiment of the present invention, an etchant is provided. The etchant includes about 10 percent by weight to about 20 percent by weight of ammonium persulfate ($NH_4$)$2S2O8$, about 2 percent by weight to about 5 percent by weight of nitric acid, about 2 percent by weight to about 5 percent by weight of ammonium acetate (CH3COONH4), about 0.5 percent by weight to about 1 percent by weight of ammonium fluoride (NH4F), about 0.05 percent by weight to about 1 percent by weight of methanesulfonic acid (CH3SO3H), about 0.1 percent by weight to about 1.5 percent by weight of aminotetrazole and a remainder of water.

According to the etchant of example embodiments of the present invention, the etchant may not use hydrogen peroxide, so that the etchant may not cause difficulties such as, for example, the generation of heat, decrease in stability, the requirement of an expensive stabilizer, etc. Accordingly, the etchant may simultaneously etch a metal layer including titanium and copper at a preferable speed, so that an etched layer may have a tapered profile in an identical process. In addition, the etchant may have high stability to maintain etching ability for a longer time. Thus, manufacturing margins may be improved, and manufacturing costs may be reduced.

BRIEF DESCRIPTION OF THE DRAWINGS

Example embodiments of the present invention can be understood in more detail from the following description taken in conjunction with the accompanying drawings in which.

DETAILED DESCRIPTION OF THE EXAMPLE EMBODIMENTS OF THE INVENTION

Figure 1:
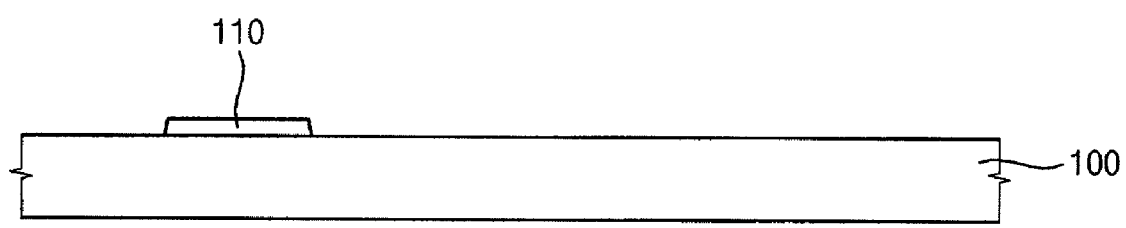
FIGS. 1 to 3 are cross-sectional views illustrating a process for manufacturing an array substrate according to an example embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative teems, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural foams as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be explained in detail with reference to the accompanying drawings.

Etchant

An etchant according to an example embodiment of the present invention includes, for example, ammonium persulfate $(NH_4)_2S_2O_8$, an inorganic acid, an acetate salt, a fluorine-containing compound, a sulfonic acid compound, an azole compound and a remainder of water. For example, the etchant includes about 0.1 percent by weight to about 30 percent by weight of ammonium persulfate, about 0.1 percent by weight to about 10 percent by weight of an inorganic acid, about 0.1 percent by weight to about 10 percent by weight of an acetate salt, about 0.01 percent by weight to about 5 percent by weight of a fluorine-containing compound, about 0.01 percent by weight to about 5 percent by weight of a sulfonic acid compound, about 0.01 percent by weight to about 2 percent by weight of an azole compound, and a remainder of water.

The etchant includes ammonium persulfate. The ammonium persulfate may function as an oxidizing agent to etch a copper layer. The ammonium persulfate etches the copper layer to form a stable compound, and the reaction between the ammonium sulfate and the copper layer may be represented by, for example, the following Reaction Formula 1.

$$S_2O_8^{-2}+2Cu \rightarrow 2CuSO_4 \qquad \text{<Reaction Formula 1>}$$

The ammonium persulfate may have a preferable degree of purity in a semiconductor process. When the content of the ammonium persulfate is less than about 0.1% by weight, etching of the copper layer may be difficult. When the content of the ammonium persulfate is greater than about 30% by weight, controlling a process may be difficult due to an excessive increase in the etching ratio of the copper layer. Thus, the content of the ammonium persulfate may be about 0.1% to about 30% by weight, preferably about 5% to about 25% by weight, and more preferably about 10% to about 20% by weight.

The etchant includes an inorganic acid. The inorganic acid may be an assistant oxidizing agent for etching the copper layer. The inorganic acid may prevent reduction of the etching ratio due to copper ions eluted in the process of etching the copper layer. The inorganic acid may include, for example, nitric acid, phosphoric acid, sulfuric acid, hydrochloric acid and the like, preferably nitric acid. These can be used alone or in a combination thereof. The inorganic acid may have a preferable degree of purity in a semiconductor process. When the content of the inorganic acid is less than about 0.1% by weight, it's efficiency as an assistant oxidizing agent may be low. When the content of the inorganic acid is greater than about 10% by weight, the etching ratio of the copper layer may excessively increase to cause disconnection of a signal line. Thus, the content of the inorganic acid may be about 0.1% to about 10% by weight, preferably about 1% to about 8% by weight, and more preferably about 2% to about 5% by weight.

The etchant includes an acetate salt. The acetate salt may control the etching ratio of the copper layer. The acetate salt may be dissociated to acetic acid ions ($CH_3COO^-$). The acetate salt may include, for example, ammonium acetate ($CH_3COONH_4$), lithium acetate ($CH_3COOLi$), potassium acetate ($CH_3COOK$) and the like, preferably ammonium acetate ($CH_3COONH_4$). These can be used alone or in a combination thereof. The acetate salt may have a preferable degree of purity in a semiconductor process. When the content of the acetate salt is less than about 0.1% by weight, controlling the etching ratio may be difficult. When the content of the acetate salt is greater than about 10% by weight, etching the copper layer may be irregular, or the copper layer may not be etched. Thus, the content of the acetate salt may be about 0.1% to about 10% by weight, preferably about 1% to about 8% by weight, and more preferably about 2% to about 5% by weight.

The etchant includes a fluorine-containing compound. The fluorine-containing compound includes fluorine, and etches a titanium layer formed below the copper layer. The fluorine-containing compound may include, for example, sodium fluoride (NaF), sodium bifluoride ($NaHF_2$), ammonium fluoride ($NH_4F$), ammonium bifluoride ($NH_4HF_2$), ammonium fluoroborate ($NH_4BF_4$), potassium fluoride (KF), potassium bifluoride ($KHF_2$), aluminum fluoride ($AlF_3$), fluoroboric acid ($HBF_4$), lithium fluoride (LiF), potassium tetrafluoroborate ($KBF_4$), calcium fluoride ($CaF_2$) and the like, preferably ammonium fluoride($NH_4F$). These can be used alone or in a combination thereof. When the content of the fluorine-containing compound is less than about 0.01% by weight, an etching of the titanium layer may be difficult. When the content of the fluorine-containing compound is greater than about 5% by weight, a glass and an insulation layer disposed below the titanium layer may be etched to cause defects. Thus, the content of the fluorine-containing compound may be about 0.01% to about 5% by weight, preferably about 0.1% to about 3% by weight, and more preferably about 0.5% to about 1% by weight.

The etchant includes a sulfonic acid compound. The sulfonic acid compound includes a sulfonic acid group ($-SO_3H$), and may prevent decomposition of the ammonium persulfate to increase the stability of the etchant. The sulfonic acid compound may include, for example, methanesulfonic acid ($CH_3SO_3H$), benzenesulfonic acid ($C_6H_5SO_3H$), p-toluenesulfonic acid ($C_7H_7SO_3H$) and the like, preferably methanesulfonic acid ($CH_3SO_3H$). These can be used alone or in a combination thereof. When the content of the sulfonic acid compound is less than about 0.01% by weight, it's efficiency as a stabilizer may be low. When the content of the sulfonic acid compound is greater than about 5% by weight, controlling a process may be difficult due to an excessive increase in the etching ratio of the copper layer. Thus, the content of the sulfonic acid compound may be about 0.01% to about 5% by weight, preferably about 0.01% to about 3% by weight, and more preferably about 0.05% to about 1% by weight.

The etchant includes an azole compound. An azole compound includes a pentagonal hetero ring containing a nitrogen atom and at least one atom different from carbon. The azole compound may inhibit etching of the copper layer to control the etching ratio difference between the copper layer and a layer including a metal different from copper. The azole compound may include, for example, benzotriazole, aminotetrazole, aminotetrazole potassium salt, imidazole, pyrazole and the like, preferably aminotetrazole. These can be used alone or in a combination thereof. When the content of the azole compound is less than about 0.01% by weight, the etching ratio of the copper may not be controlled to cause excessive CD loss. When the content of the azole compound is greater than about 2% by weight, etching of the copper layer may be irregular, or the copper layer may not be etched. Thus, the content of the azole compound may be about 0.01% to about 2% by weight, and preferably about 0.1% to about 1.5% by weight.

The etchant may further include, for example, about 0.01 percent by weight to about 5 percent by weight of a boron-containing compound.

The boron-containing compound includes boron, and may uniformly control the etching ratio of the titanium layer. The boron-containing compound may include, for example, borate ($R_1BO_3$, $R_2HBO_3$, $R_3H_2BO_3$), metaborate ($R_3BO_2$), tetraborate ($R_2B_4O_7$, $R_3HB_4O_7$), ammonium fluoroborate ($NH_4BF_4$), fluoroboric acid ($HBF_4$), lithium fluoroborate ($LiBF_4$), sodium fluoroborate ($NaBF_4$), potassium fluoroborate ($KBF_4$) and the like, preferably fluoroboric acid ($HBF_4$). R1 represents $H_3$, $Li_3$, $Na_3$, $(NH_4)_3$ or $K_3$. R2 represents $Li_2$, $Na_2$, $K_2$ or $(NH_4)_2$. R3 represents Li, Na, K or $NH_4$. These can be used alone or in a combination thereof. When the content of the boron-containing compound is less than about 0.01% by weight, controlling the etching ratio of the titanium layer may be difficult. When the content of the boron-containing compound is greater than about 5% by weight, etching of the titanium layer may be difficult. Thus, the content of the boron-containing compound may be about 0.01% to about 5% by weight, preferably about 0.05% to about 3% by weight.

The etchant of the present invention includes ammonium persulfate (($NH_4)_2S_2O_8$), an inorganic acid, an acetate salt, a fluorine-containing compound, a sulfonic acid compound, an azole compound and a remainder of water. The water, for example, pure water, ultrapure water, deionized water, distilled water, and the like may be used for the etchant. The content of the water may be properly controlled based on the contents of the composition.

The etchant of the present invention may have high stability. The etchant may simultaneously etch a metal layer including titanium and copper for forming a gate line in an identical process, so that an etched layer has a tapered profile. Thus, manufacturing margins may be improved.

Although the example embodiments of the present invention have been described, it is understood that the present invention should not be limited to these example embodiments but various changes of the contents and substitutions of the components can be made by one ordinary skilled in the art within the spirit and scope of the present invention.

The invention is described more fully hereinafter with reference to examples. This invention may, however, be embodied in many different forms and should not be construed as limited to the examples.

EXAMPLES OF ETCHANTS

Examples 1 to 7 were prepared according to the following Table 1.

TABLE 1

| Composition | Example 1 | 2 | 3 | 4 | 5 | 6 | 7 |
|---|---|---|---|---|---|---|---|
| Ammonium persulfate | 12 | 12 | 12 | 12 | 12 | 12 | 12 |
| Nitric acid | 3 | 3 | 3 | 3.4 | 3 | 3 | 3 |
| Ammonium acetate | 3 | 3 | 3 | 3 | 3.4 | 3 | 3 |
| Fluoroboric acid | 0 | 0.2 | 0 | 0 | 0.2 | 0.5 | 0.5 |
| Ammonium fluoride | 0.8 | 0.8 | 0.8 | 0.8 | 0.8 | 0.8 | 1.0 |
| Methanesulfonic acid | 0.1 | 0.1 | 0.1 | 0.1 | 0.1 | 0.1 | 0.1 |
| Aminotetrazole | 1 | 1 | 1 | 1 | 1 | 1 | 1 |
| Water | 80.1 | 79.9 | 80.1 | 79.7 | 79.5 | 79.6 | 79.4 |

Referring to Table 1, an etchant of Example 1 includes about 12% by weight of ammonium persulfate, about 3% by weight of nitric acid, about 3% by weight of ammonium acetate, about 0.8% by weight of ammonium fluoride, about 0.1% by weight of methanesulfonic acid, about 1% by weight of aminotetrazole, and about 80.1% by weight of water.

An etchant of Example 2 includes about 12% by weight of ammonium persulfate, about 3% by weight of nitric acid, about 3% by weight of ammonium acetate, about 0.2% by weight of fluoroboric acid, about 0.8% by weight of ammonium fluoride, about 0.1% by weight of methanesulfonic acid, about 1% by weight of aminotetrazole, and about 79.9% by weight of water.

An etchant of Example 3 includes about 15% by weight of ammonium persulfate, about 3% by weight of nitric acid, about 3% by weight of ammonium acetate, about 0.8% by weight of ammonium fluoride, about 0.1% by weight of methanesulfonic acid, about 1% by weight of aminotetrazole, and about 80.1% by weight of water.

An etchant of Example 4 includes about 12% by weight of ammonium persulfate, about 3.4% by weight of nitric acid, about 3% by weight of ammonium acetate, about 0.8% by weight of ammonium fluoride, about 0.1% by weight of methanesulfonic acid, about 1% by weight of aminotetrazole, and about 79.7% by weight of water.

An etchant of Example 5 includes about 12% by weight of ammonium persulfate, about 3% by weight of nitric acid, about 3.4% by weight of ammonium acetate, about 0.2% by weight of fluoroboric acid, about 0.8% by weight of ammonium fluoride, about 0.1% by weight of methanesulfonic acid, about 1% by weight of aminotetrazole, and about 79.5% by weight of water.

An etchant of Example 6 includes about 12% by weight of ammonium persulfate, about 3% by weight of nitric acid, about 3% by weight of ammonium acetate, about 0.5% by weight of fluoroboric acid, about 0.8% by weight of ammonium fluoride, about 0.1% by weight of methanesulfonic acid, about 1% by weight of aminotetrazole, and about 79.6% by weight of water.

An etchant of Example 7 includes about 12% by weight of ammonium persulfate, about 3% by weight of nitric acid, about 3% by weight of ammonium acetate, about 0.5% by weight of fluoroboric acid, about 1.0% by weight of ammonium fluoride, about 0.1% by weight of methanesulfonic acid, about 1% by weight of aminotetrazole, and about 79.4% by weight of water.

Experiment

Evaluation of Etching Ability

Each of the etchants of Examples 1 to 7 was provided to a titanium/copper (Ti/Cu) bilayer formed on a glass substrate to evaluate etching ratios, cut dimension (CD) skews and taper angles, and the Ti/Cu bilayer was over-etched by about 60% based on an etching time. Furthermore, a profile of each etched Ti/Cu bilayer was observed through a microscope. Obtained results are tabulated in the following Table 2.

TABLE 2

|  | End Point of Etching Cu (s) | End Point of Etching Ti (s) | CD Skew (μm) | Taper Angle (°) |
|---|---|---|---|---|
| Example 1 | 26 | 6 | 0.352 | 40 |
| Example 2 | 23 | 8 | 0.237 | 40 |
| Example 3 | 24 | 6 | 0.393 | 60 |
| Example 4 | 20 | 6 | 0.384 | 55 |
| Example 5 | 32 | 8 | 0.384 | 45 |
| Example 6 | 23 | 15 | 0.492 | 35 |
| Example 7 | 23 | 10 | 0.419 | 60 |

The end point of etching corresponds to a lapse of time until the Ti/Cu bilayer was completely etched to expose the glass substrate. As the end point of etching decreases, etching ability increases. The CD skew corresponds to a distance between an end of the Ti/Cu bilayer and an end of a photoresist pattern formed on the Ti/Cu bilayer. The CD skew needs to be within an appropriate range so that a step difference may be prevented and so that the etched Ti/Cu bilayer may have a uniform tapered profile. The taper angle is an angle of an etched metal layer, when viewed from a side view. A preferable taper angle may be about 45 degrees to about 60 degrees.

Referring to Table 2, it can be noted that Examples 1 to 7 have high etching ratios and proper CD skews. Furthermore, it can be noted that Examples 1 to 7 may form a tapered profile with about 30 degrees to about 70 degrees.

Method of Manufacturing an Array Substrate

Figure 2:
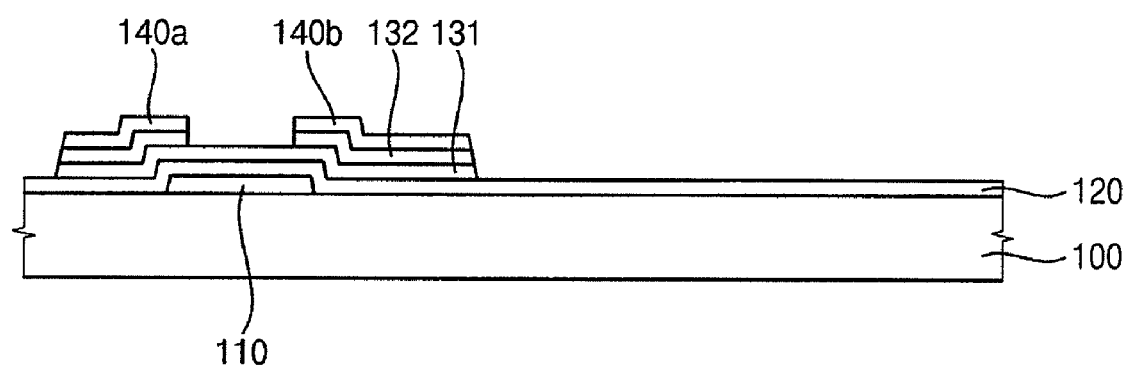
Figure 3:
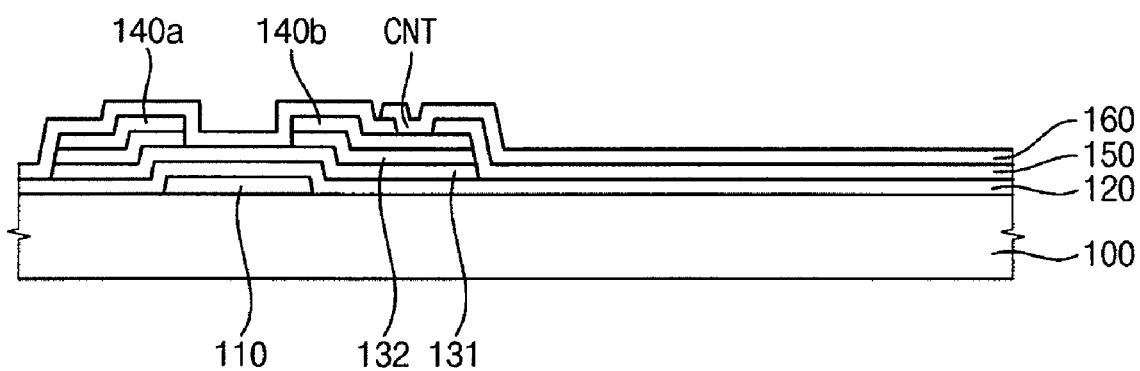

FIGS. 1 to 3 are cross-sectional views illustrating a process for manufacturing an array substrate according to an example embodiment of the present invention.

Referring to FIG. 1, a first conductive layer is formed on a base substrate 100, and is patterned to form a gate line and a gate electrode 110. The gate line and the gate electrode 110 may be formed as, for example, a bilayer in which the Ti layer and Cu layer are sequentially deposited. For example, the gate line and the gate electrode 110 may include a first metal layer including titanium and a second metal layer including copper which is disposed on the first metal layer.

Referring to FIG. 2, a gate insulation layer 120 is formed on the gate line and the gate electrode 110. The gate insulation layer 120 is formed from, for example, a silicon oxide layer, a silicon nitride layer, or a multilayer structure thereof. The gate insulation layer 120 may be formed using, for example, chemical vapor deposition (CVD) or a sputtering process.

An active layer 131 and an ohmic contact layer 132 are deposited on the gate insulation layer 120 corresponding to the gate electrode 110 to form a semiconductor layer 130. For example, the active layer 131 may include amorphous silicon. The ohmic contact layer 132 may include, for example, amorphous silicon doped with n-type or p-type impurities. The ohmic contact layer 132 may form patterns spaced apart from each other.

A second conductive layer is formed on the semiconductor layer 130, and is patterned to foam a data line, a source electrode 140a, and a drain electrode 140b. The data line, the source electrode 140a, and the drain electrode 140b may be formed as, for example, a bilayer in which a Ti layer and a Cu layer are sequentially deposited. For example, the data line, the source electrode 140a, and the drain electrode 140b may include a first metal layer including titanium and a second metal layer including copper which is disposed on the first metal layer.

Referring to FIG. 3, a passivation layer 150 is formed on the data line, the source electrode 140a and the drain electrode 140b. A contact hole CNT is formed to expose a portion of the drain electrode 140b. The passivation layer 150 may include, for example, silicon nitride, silicon oxide, etc.

A third conductive layer is foamed on the passivation layer 150, and is patterned to form a pixel electrode 160 electrically being connected to the drain electrode 140b through the contact hole CNT.

The pixel electrode 160 may include, for example, indium tin oxide (ITO), indium zinc oxide (IZO), etc.

Each of the gate electrode 110, the source electrode 140a, drain electrode 140b, and the pixel electrode 160 may be patterned using the same etchant composition. The etchant may include, for example, about 0.1 percent by weight to about 30 percent by weight of ammonium persulfate, about 0.1 percent by weight to about 10 percent by weight of an inorganic acid, about 0.1 percent by weight to about 10 percent by weight of an acetate salt, about 0.01 percent by weight to about 5 percent by weight of a fluorine-containing compound, about 0.01 percent by weight to about 5 percent by weight of a sulfonic acid compound, about 0.01 percent by weight to about 2 percent by weight of an azole compound, and a remainder of water.

According to the etchant of example embodiments of the present invention, the etchant may not use hydrogen peroxide, so that the etchant may not cause difficulties such as, for example, the generation of heat, decrease in stability, the requirement of an expensive stabilizer, etc. Accordingly, the etchant may simultaneously etch a metal layer including titanium and copper at a preferable speed, so that an etched layer has a tapered profile in an identical process. In addition, the etchant may have high stability to maintain etching ability for a longer time. Thus, manufacturing margins may be improved, and manufacturing costs may be reduced.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. An etchant, comprising:
about 0.1 percent by weight to about 30 percent by weight of ammonium persulfate $(NH_4)_2S_2O_8$;
about 0.1 percent by weight to about 10 percent by weight of an inorganic acid;
about 0.1 percent by weight to about 10 percent by weight of an acetate salt;
about 0.01 percent by weight to about 5 percent by weight of a fluorine-containing compound;
about 0.01 percent by weight to about 5 percent by weight of a sulfonic acid compound;
about 0.01 percent by weight to about 2 percent by weight of an azole compound; and
a remainder of water,
wherein the etchant does not include hydrogen peroxide.

2. The etchant of claim 1, wherein the inorganic acid comprises at least one selected from the group consisting of nitric acid, phosphoric acid, sulfuric acid, and hydrochloric acid.

3. The etchant of claim 1, wherein the acetate salt comprises at least one selected from the group consisting of ammonium acetate $(CH_3COONH_4)$, lithium acetate $(CH_3COOLi)$, and potassium acetate $(CH_3COOK)$.

4. The etchant of claim 1, wherein the fluorine-containing compound comprises at least one selected from the group consisting of sodium fluoride (NaF), sodium bifluoride (NaHF$_2$), ammonium fluoride (NH$_4$F), ammonium bifluoride (NH$_4$HF$_2$), ammonium fluoroborate (NH$_4$BF$_4$), potassium fluoride (KF), potassium bifluoride (KHF$_2$), aluminum fluoride (AlF$_3$), fluoroboric acid (HBF$_4$), lithium fluoride (LiF), potassium tetrafluoroborate (KBF$_4$), and calcium fluoride (CaF$_2$).

5. The etchant of claim 1, wherein the sulfonic acid compound comprises at least one selected from the group consisting of methanesulfonic acid (CH$_3$SO$_3$H), benzenesulfonic acid (C$_6$H$_5$SO$_3$H), and p-toluenesulfonic acid (C$_7$H$_7$SO$_3$H).

6. The etchant of claim 1, wherein the azole compound comprises at least one selected from the group consisting of benzotriazole, aminotetrazole, aminotetrazole potassium salt, imidazole, and pyrazole.

7. The etchant of claim 1, further comprising about 0.01 percent by weight to about 5 percent by weight of a boron-containing compound.

8. The etchant of claim 7, wherein the boron-containing compound comprises at least one selected from the group consisting of borate (R$_1$BO$_3$, R$_2$HBO$_3$, R$_3$H$_2$BO$_3$), metaborate (R$_3$BO$_2$), tetraborate (R$_2$B$_4$O$_7$, R$_3$HB$_4$O$_7$), ammonium fluoroborate (NH$_4$BF$_4$), fluoroboric acid (HBF$_4$), lithium fluoroborate (LiBF$_4$), sodium fluoroborate (NaBF$_4$), and potassium fluoroborate (KBF$_4$), wherein R$_1$ represents H$_3$, Li$_3$, Na$_3$, (NH$_4$)$_3$ or K$_3$; R$_2$ represents Li$_2$, Na$_2$, K$_2$ or (NH$_4$)$_2$; and R$_3$ represents Li, Na, K or NH$_4$.

9. The etchant of claim 1, wherein the etchant is used for simultaneously etching a first metal layer including titanium and a second metal layer including copper formed on the first metal layer.

10. An etchant, comprising:
about 10 percent by weight to about 20 percent by weight of ammonium persulfate (NH$_4$)$_2$S$_2$O$_8$;
about 2 percent by weight to about 5 percent by weight of nitric acid;
about 2 percent by weight to about 5 percent by weight of ammonium acetate (CH$_3$COONH$_4$);
about 0.5 percent by weight to about 1 percent by weight of ammonium fluoride (NH$_4$F);
about 0.05 percent by weight to about 1 percent by weight of methanesulfonic acid (CH$_3$SO$_3$H);
about 0.1 percent by weight to about 1.5 percent by weight of aminotetrazole; and
a remainder of water.

11. The etchant of claim 10, further comprising about 0.01 percent by weight to about 5 percent by weight of a boron-containing compound.

12. The etchant of claim 11, wherein the boron-containing compound comprises fluoroboric acid (HBF$_4$) in an amount of about 0.05% to about 3% by weight.

* * * * *